United States Patent
Nagasaki et al.

(10) Patent No.: US 6,822,069 B2
(45) Date of Patent: Nov. 23, 2004

(54) POLY (5-AMINOQUINOXALINES) AND USE THEREOF

(75) Inventors: Yukio Nagasaki, Moriya (JP); Hitoshi Furusho, Tokyo (JP); Katsumi Chikama, Funabashi (JP); Hisae Miyamoto, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/429,889

(22) Filed: May 6, 2003

(65) Prior Publication Data

US 2003/0215701 A1 Nov. 20, 2003

(30) Foreign Application Priority Data

May 10, 2002 (JP) ........................................ 2002-135721
Jun. 26, 2002 (JP) ........................................ 2002-185876

(51) Int. Cl.$^7$ .......................... C08G 73/00; H01M 4/00; H01M 6/10; H01J 1/62; H01J 63/04
(52) U.S. Cl. .......................... 528/422; 429/94; 313/504; 252/582
(58) Field of Search ........................... 528/422; 429/94; 313/504; 252/582

(56) References Cited

U.S. PATENT DOCUMENTS 4,356,429 A  10/1982  Tang

OTHER PUBLICATIONS

Hrdlicka et al., Journal of Molecular Structure, vol. 565–566, pp. 101–105 (May 30, 2001).
Gillespie et al., Journal of the American Chemical Society, vol. 79, No. 9, pp. 2245–2248, (May 5, 1957).

Primary Examiner—Duc Truong

(74) Attorney, Agent, or Firm—Birch, Stewart, Kolasch & Birch, LLP

(57) ABSTRACT

Poly(5-aminoquinoxalines) having the general formula (1):

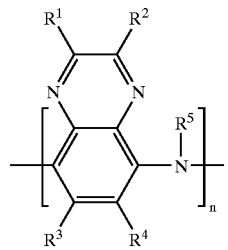

(1)

In which $R^1$ and $R^2$ each independently represent a hydrogen atom, a hydroxyl group, a phenyl group, a substituted phenyl group, a biphenyl group, a substituted biphenyl group, a thienyl group, a substituted thienyl group, a naphthyl group, a substituted naphthyl group, pyrrolyl group, a substituted pyrrolyl group, a furyl group, a substituted furyl group, an alkyl group, an alkoxyl, or an alkoxyl group; $R^3$ and $R^4$ each independently represent a hydrogen atom, an alkyl group, an alkoxyl group, a cyano group, a phenyl group, a substituted phenyl group, a biphenyl group, a substituted biphenyl group, a thienyl group, a substituted thienyl group, a pyrrolyl group, a substituted pyrrolyl group, a furyl group, a substituted furyl group, a naphthyl group, or a substituted naphthyl group; $R^5$ represents a hydrogen atom, an alkyl group, an alkoxyl group, an acetyl group, a cyano group, a phenyl group, a substituted phenyl group, a biphenyl group, a substituted biphenyl group, a thienyl group, a substituted thienyl group, a pyrrolyl group, a substituted pyrrolyl group, a naphthyl group, or a substituted naphthyl group; and n is a positive integer of not less than three. The polymers have excellent thermal resistance, permit easy control of the electrochemical oxidation-reduction potential thereof, have a very narrow band gap of themselves, and have strong fluorescence characteristics.

19 Claims, No Drawings

POLY (5-AMINOQUINOXALINES) AND USE THEREOF

This nonprovisional application claims priority under 35 U.S.C. § 119(a) on Patent Application No(s). 2002-135721 filed in JAPAN on May 10, 2002 and 2002-185876 filed in JAPAN on Jun. 26, 2002, which is(are) herein incorporated by reference.

BACKGROUND OF THE INVENTION

The present invention relates to poly(5-aminoquinoxalines) which have excellent thermal resistance, permits easy control of electrochemical oxidation-reduction potential, has a very narrow band gap of itself and has strong fluorescence characteristics, and application of the same.

These polymers have an electron-donating group and an electron-accepting group in one molecule thereof, whereby they have p-type and n-type semiconductor characteristics. These compounds can easily be formed into a thin film by the spin coating method, and can be applied as an active substance or an electrode material for a battery, an organic electroluminescence device material, an electroluminescence device material, a semiconductor, a semiconductor device, and a nonlinear-type optical material.

In recent years, aromatic compounds with a π conjugated system spread in two dimensions and heterocyclic compounds having a hetero-atom have been used for a variety of electronic devices through utilization of their light emission characteristics and electron and positive hole transport characteristics. For example, organic electroluminescence devices are generally classified into high polymeric devices utilizing the π conjugated system and low molecular weight devices with various functions separately possessed by layers which are laminated. Particularly, in the case of the low molecular weight materials, there has been a requirement for their carrier mobility and fluorescence characteristics, and it has been required to freely change the band gap in developing derivatives thereof. In addition, for these materials, film characteristics thereof are important, and they have been demanded particularly to form a stable amorphous film (Polymer, 24(1983), p. 748; Jpn. J. Appl. Phys. 25(1986), L773; Appl. Phys. Lett. 51(1987), P. 913; U.S. Pat. No. 4,356,429).

In the battery, also, there is a demand for control of the oxidation and reduction potentials of the compound (for example, Denki Kagaku Oyobi Kogyo Butsuri Kagaku (Electrochmistry and Industrial Physical Chemistry), Vol. 54, p. 306 (1986)). As to the electrode active substance used in the battery, in relation to the electrolyte, it is necessary to set the oxidation-reduction potential of the substance to within the dessociation voltage of the electrolyte, and, therefore, control of the oxidation-reduction potential has been an important problem.

As for the semiconductor characteristics, π conjugated system polymers have been investigated for the purpose of achieving a narrower band gap, but, generally, the π conjugated system polymers are insoluble in solvents and are difficult to deal with, and it has been difficult to control the structure of the polymers. In addition, as another method of narrowing the band gap, there is a method of spreading the π conjugated system in two dimensions (Synthetic Metals, 69(1995), pp. 599–600; J. Am. Chem. Soc. 177(25), 1995, pp. 6791–6792), but these materials are also insoluble and infusible and are inconvenient to deal with. Besides, general π conjugates system polymers can display behaviors as an impurity semiconductor upon being doped with an impurity, but it has been difficult to stably form p-type and n-type semiconductors from one substance.

SUMMARY OF THE INVENTION

The present invention has been completed based on the results of earnest studies in search of a compound having a novel molecular structure, in consideration of the above circumstances. Accordingly, it is an object of the present invention to provide poly(5-aminoquinoxalines) which have excellent thermal resistance, are soluble in water or an organic solvent, permit control of degree of depolarization and electrochemical oxidation-reduction potential thereof, show a clear color change due to chemical or electrochemical oxidation or reduction, and are themselves electrically conductive.

It is another object of the present invention to utilize such novel poly(5-aminoquinoxalines) as an organic electroluminescence device, an electrochromic device, an active substance or an electrode for a battery, a semiconductor, an n-type semiconductor, a solar-cell electrode, a non-linear device, etc., by forming the novel poly(5-aminoquinoxalines) into a film or the like through the spin coating method or the like.

In accordance with one aspect of the present invention, there is provided a poly(5-aminoquinoxaline) having the general formula (1):

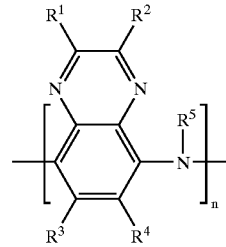

(1)

in which $R^1$ and $R^2$ each independently represent a hydrogen atom, a hydroxyl group, a phenyl group, a substituted phenyl group, a biphenyl group, a substituted biphenyl group, a thienyl group, a substituted thienyl group, a naphthyl group, a substituted naphthyl group, a pyrrolyl group, a substituted pyrrolyl group, furyl group, a substituted furyl group, an alkyl group, or an alkoxyl group; $R^3$ and $R^4$ each independently represent a hydrogen atom, an alkyl group, an alkoxyl group, a cyano group, a phenyl group, a substituted phenyl group, a biphenyl group, a substituted biphenyl group, a thienyl group, a substituted thienyl group, a pyrrolyl group, a substituted pyrrolyl group, a furyl group, a substituted furyl group, a naphthyl group, or a substituted naphthyl group; $R^5$ represents a hydrogen atom, an alkyl group, an alkoxyl group, an acetyl group, a thienyl group, a substituted thienyl group, a pyrrolyl group, a substituted pyrrolyl group, a naphthyl group, or a substituted naphthyl group; and n represents a positive integer of not less than three.

In the general formula (1) above, $R^1$ and $R^2$ may independently be groups having the general formula (2):

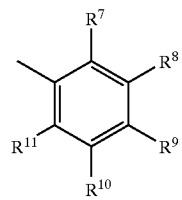
(2)

in which $R^7$ to $R^{11}$ each independently represent a hydrogen atom, a halogen atom, a cyano group, an amino group, a cyanoalkyl group having one to four carbon atoms, a haloalkyl group having one to four carbon atoms, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group.

In the general formula (1) above, $R^1$ and $R^2$ may independently be groups having the general formula (3):

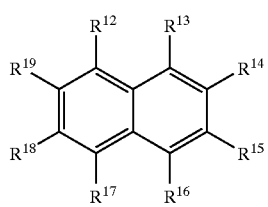
(3)

in which either one of $R^{12}$ to $R^{19}$ is coupled to the quinoxaline ring; and the others of $R^{12}$ to $R^{19}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group.

In the general formula (1) above, $R^1$ and $R^2$ may independently be groups having the general formula (4):

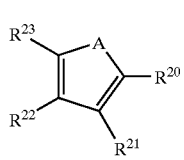
(4)

in which either one of $R^{20}$ to $R^{23}$ is coupled to the quinoxaline ring; the others of $R^{20}$ to $R^{23}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group; and A represents NH, O, or S.

In the general formula (1) above, $R^1$ and $R^2$ may independently be groups having the general formula (5):

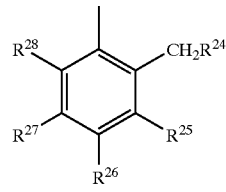
(5)

in which $R^{24}$ represents a halogen atom or a cyano group; and $R^{25}$ to $R^{28}$ each independently represent a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

In the general formula (1) above, $R^5$ may be a group having the general formula (6):

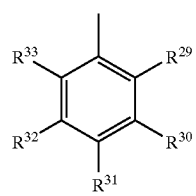
(6)

in which $R^{29}$ to $R^{33}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

In the general formula (1) above, $R^5$ may be a group having the general formula (7):

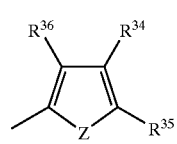
(7)

in which $R^{34}$ to $R^{36}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Z represents NH, O, or S.

In the general formula (1) above, $R^5$ may be a group having the general formula (8):

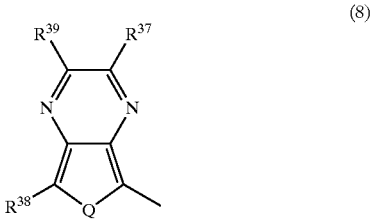

(8)

in which $R^{37}$ to $R^{39}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Q represents NH, O, or S.

In the general formula (1) above, $R^5$ may be a group having the general formula (9):

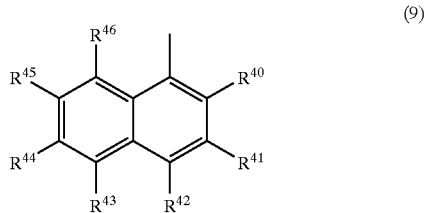

(9)

in which $R^{40}$ to $R^{46}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

In accordance with another aspect of the present invention, there are provided applications of the poly(5-aminoquinoxaline) represented by the general formula (1) above. The applications of the poly(5-aminoquinoxaline) of the general formula (1) reside in: a film formed by spin coating or casting of a poly(5-aminoquinoxaline) of the formula (1); a film formed by compression molding of a poly(5-aminoquinoxaline) of the formula (1); an electrochromic device including a poly(5-aminoquinoxaline) of the formula (1); an active substance or an electrode for a battery, including a poly(5-aminoquinoxaline) of the formula (1); a semiconductor including a poly(5-aminoquinoxaline) of the formula (1); a p-type semiconductor produced by oxidizing a poly(5-aminoquinoxaline) of the formula (1) by an oxidant or electrochemical doping; an n-type semiconductor produced by reducing a poly(5-aminoquinoxaline) of the formula (1) by a reducing agent or electrochemical doping; a solar cell comprising the p- and n-type semiconductors; an organic electroluminescence device including a poly(5-aminoquinoxaline) of the formula (1); and a non-linear organic material including a poly(5-aminoquinoxaline) of the formula (1).

The novel poly(5-aminoquinoxalines) according to the present invention have good thermal resistance and are soluble in water or organic solvents. Therefore, the polymers find a wide range of utilization, and can be dry formed into fibers, films and the like by utilizing solutions obtained by dissolving the polymers in appropriate solvents. In addition, due to the structure thereof, the novel polymers according to the present invention have excellent properties that are not possessed by the conventional polyarylenes; for example, the polymers of the invention permit control of the degree of depolarization and the electrochemical oxidation-reduction potential thereof. Besides, according to the method of the present invention which will be described later, it is possible to obtain a polymer in which electric charges are localized along the π conjugated system. In addition, the polymers according to the present invention themselves are electrically conductive.

The above and other objects, features and advantages of the present invention will become apparent from the following description of the preferred embodiments and appended claims of the invention.

DESCRIPTION OF THE PREFERRED EMBODIMENTS

The poly(5-aminoquinoxalines) according to the present invention are the polymers represented by the general formula (1):

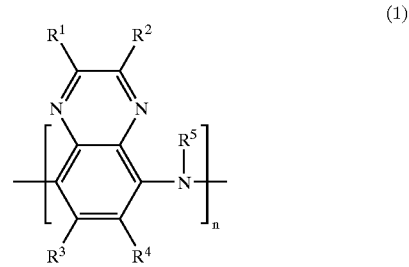

(1)

In the above formula, $R^1$ and $R^2$ each independently represent a hydrogen atom, a hydroxyl group, a phenyl group, a substituted phenyl group, a biphenyl group, a substituted biphenyl group, a thienyl group, a substituted thienyl group, a naphthyl group, a substituted naphthyl group, a pyrrolyl group, a substituted pyrrolyl group, a furyl group, a substituted furyl group, an alkyl group, or an alkoxyl group. In this case, the substituent group is preferably an alkyl group or an alkoxyl group. The alkyl group or alkoxyl group is preferably one having one to ten carbon atoms, particularly one having one to five carbon atoms (the same applies hereinafter).

$R^1$ and $R^2$ are preferably hydroxyl groups, non-substituted or substituted phenyl groups, thienyl groups, naphthyl groups, pyrrolyl groups, or biphenyl groups, and the preferable examples thereof includes the groups represented by the formulas (2) to (5):

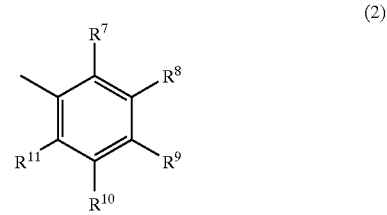

(2)

in which $R^7$ to $R^{11}$ each independently represent a hydrogen atom, a halogen atom, a cyano group, an amino group, a cyanoalkyl group having one to four carbon atoms, a haloalkyl group having one to four carbon atoms, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group;

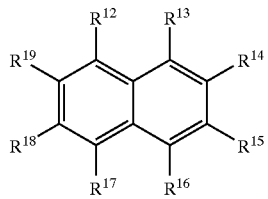

(3)

in which either one of $R^{12}$ to $R^{19}$ is coupled to the quinoxaline ring, and the others of $R^{12}$ to $R^{19}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group;

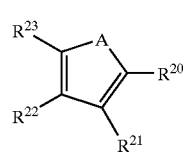

(4)

in which either one of $R^{20}$ to $R^{23}$ is coupled to the quinoxaline ring; the others of $R^{20}$ to $R^{23}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group; and A represents NH, O, or S;

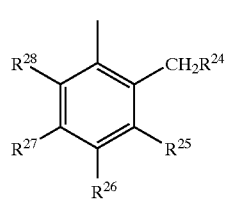

(5)

in which $R^{24}$ represents a halogen atom or a cyano group; and $R^{25}$ to $R^{28}$ each independently represent a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

In the general formula (1) above, in consideration of the solubility of the substituent groups $R^1$ and $R^2$, the substituent groups $R^1$ and $R^2$ are each desirably a substituted hydroxyl, phenyl, thienyl, naphthyl, pyrrolyl or biphenyl group. In this case, the substituent groups on $R^1$ and $R^2$ are each preferably an alkyl or alkoxyl group having one to ten carbon atoms, and more preferably an alkyl or alkoxyl group having one to five carbon atoms.

In consideration of amorphousness of a spin-coated film or the like, t-butyl group or t-butoxy group is most suitable. Where $R^1$ and $R^2$ are substituted aryl, thienyl or pyrrolyl groups and the substituent groups thereon are each an alkyl group, the compound can further be bromided by use of N-bromosuccinimide, and the bromided compound can further be converted into a cyano compound by reaction with NaCN.

In the general formula (1) above, $R^3$ and $R^4$ each independently represent a hydrogen atom, an alkyl group, an alkoxyl group, a cyano group, a hydroxyl group, a phenyl group, a substituted phenyl group, a biphenyl group, a substituted biphenyl group, a thienyl group, a substituted thienyl group, a pyrrolyl group, a substituted pyrrolyl group, a furyl group, a substituted furyl group, a naphthyl group, or a substituted naphthyl group. Among them, a hydrogen atom, an alkyl group and an alkoxyl group are preferred.

The alkyl and alkoxyl groups used as $R^3$ and $R^4$ desirably have one to ten carbon atoms, and more desirably one to five carbon atoms. Further, for enhancing semiconductor characteristics, $R^3$ and $R^4$ are each desirably a phenyl, thienyl or naphthyl group or a substituted phenyl, thienyl or naphthyl group. In the case of the substituted groups, the substituent groups are each preferably an alkyl or alkoxyl group having one to ten carbon atoms, and more preferably an alkyl or alkoxyl group having one to five carbon atoms.

$R^5$ in the general formula (1) above represents a hydrogen atom, an alkyl group, an alkoxyl group, an acetyl group, a phenyl group, a substituted phenyl group, a biphenyl group, a substituted biphenyl group, a naphthyl group, a substituted naphthyl group, a thienyl group, a substituted thienyl group, a pyrrolyl group or a substituted pyrrolyl group. Among them, a hydrogen atom, an alkyl group and an alkoxy group are preferred. For stably obtaining an amorphous film of the polymer, $R^5$ is preferably at least an alkyl or alkoxyl group having one to ten carbon atoms, and more preferably an alkyl or alkoxyl group having two to five carbon atoms.

In addition, for enhancing semiconductor characteristics, $R^5$ is preferably a phenyl, naphthyl or thienyl group; in this case, for stably maintaining the amorphousness of the film of the polymer, $R^5$ is preferably a substituted phenyl, naphthyl or thienyl group. In the case of the substituted group, the substituent group is preferably an alkyl or alkoxyl group having one to ten carbon atoms, and more preferably an alkyl or alkoxyl group having one to five carbon atoms.

Examples of $R^5$ include the groups represented by the following general formulas (6) to (9):

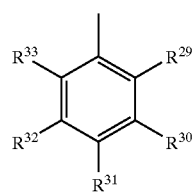

(6)

in which $R^{29}$ to $R^{33}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group;

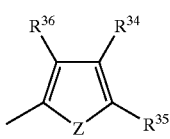

(7)

in which $R^{34}$ to $R^{36}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Z represents NH, O, or S;

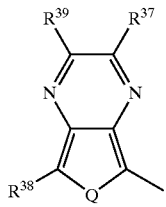

(8)

in which $R^{37}$ to $R^{39}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Q represents NH, O, or S;

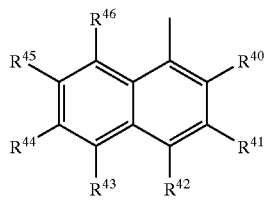

(9)

in which $R^{40}$ to $R^{46}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

Besides, in the general formula (1) above, n is a positive integer of not less than three, and particularly 3 to 400.

In this case, the molecular weight of the poly(5-aminoquinoxalines) according to the present invention is not particularly limited, but it is preferable that the weight average molecular weight is 1,000 to 100,000, particularly 4,000 to 50,000. Therefore, n in the general formula (1) is preferably such a number as to make the poly(5-aminoquinoxaline) have a weight average molecular weight in the just-mentioned range.

In the method of preparing the poly(5-aminoquinoxalines) according to the present invention, 5-aminoquinoxaline constituting a fundamental skeleton in the formula (1) is already known, and can be synthesized by a known method (J. Am. Chem. Soc. 79, pp. 2245–2248 (1957); J. Org. Chem. 31, pp. 3384–3390 (1966)). For example, by dissolving a 5-nitroquinoxaline having the following formula (10) in an appropriate solvent and reducing it by use of PdC and hydrogen gas, a 5-aminoquinoxaline of the following formula (11) can be prepared. The 5-nitroquinoxaline of the formula (10) can be synthesized by a known method (J. Chem. Soc., 1953, pp. 2822–2830).

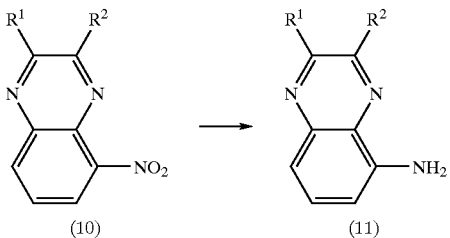

in which $R^1$ and $R^2$ have the same meanings as in the general formula (1) above.

The method for obtaining the polymer represented by the general formula (1) above is not particularly limited, and there can be used chemical oxidation polymerization, electrolytic oxidation polymerization, and catalytic polymerization. For example, as a general polymerization method, chemical oxidation polymerization is preferably used. In this case, the oxidant is not particularly limited, and ammonium persulfate, tetraammonium peroxide, iron chloride or cerium sulfate are generally used. The polymerization is generally conducted by converting the amine derivative (11), which is the monomer of the polymer represented by the formula (1), into a salt by use of hydrochloric acid, then adding the oxidant, and carrying out the polymerization reaction at a low temperature, preferably at or below 10° C. when ammonium persulfate is used, and, in the case where precipitation of the monomer is not observed, more preferably at 0° C. When an oxidation catalyst such as iron chloride or cerium sulfate, the reaction is generally conducted under an atmosphere of $N_2$ at a reaction temperature of room temperature to 60° C.

As a method for obtaining the polymer from a small amount of the monomer, electrolytic oxidation polymerization is preferably used. The polymerization is generally conducted by converting the amine derivative (11), which is the monomer of the polymer represented by the formula (1), into a salt by use of hydrochloric acid, and then carrying out the oxidation reaction at a low temperature, preferably at or below 10° C., and, in the case where precipitation of the monomer is not observed, more preferably at 0° C. In the polymerization, generally, $Ag/Ag^+$ is used as a reference electrode, platinum is used as a counter electrode, ITO or platinum electrode is used as a working electrode, and it is important to select the electrodes according to the acidity of the solution. Namely, in the electrolytic oxidation polymerization in a solution with high acidity, preferably platinum electrodes are generally used, while, in a neutral region, ITO, platinum or the like electrodes can be used. For the electrolytic polymerization, there can be used the potentiostatic electrolysis in which the oxidation potential is measured and then polymerization is conducted potentiostatically while maintaining the potential, the sweep method in which the oxidation potential and the reduction potential are scanned several times, and the galvanostatic electrolysis in which the current is maintained at a constant value; in any case, the polymer can be obtained. In the case of using the monomer (11) which is a precursor of the polymer represented by the formula (1), it is preferable to use the potentiostatic electrolysis at a voltage of 1300 mV, while using $Ag/Ag^+$ as the reference electrode, platinum as the counter electrode and ITO as the working electrode, for measuring the oxidation potential.

Incidentally, where $R^3$ and $R^4$ in the general formula (1):

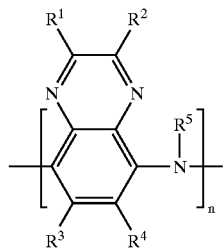

(1)

are each a group other than the hydrogen atom, the groups $R^3$ and $R^4$ may be introduced into the formula (10) or the formula (11), or may be introduced into the polymer after polymerization. In addition, where $R^5$ is a group other than the hydrogen atom, the group $R^5$ may be introduced into the formula (11), or may be introduced into the polymer after polymerization. In this case, the introduction of these groups $R^3$, $R^4$ and $R^5$ can be carried out by a known method.

The poly(5-aminoquinoxalines) according to the present invention are soluble in water and in organic solvents such as dimethylformamide (DMF), N-methylpyrrolidone (NMP), acetonitrile and halogenated benzene, and can be easily formed into a film by the spin coating method or the casting method. In addition, the powder of the poly(5-aminoquinoxalines) according to the present invention can be easily formed into a film by the compression molding method.

The compounds according to the present invention, by utilizing the excellent properties thereof, are applicable to films, an electrochromic device, a semiconductor, a battery, a solar cell, an organic electroluminescence device, a non-linear material, and an active substance or an electrode for a battery. In addition, the compounds according to the present invention themselves are electrically conductive. Furthermore, the compounds according to the present invention can be utilized as a p-type or n-type semiconductor, by oxidizing or reducing the compounds through the use of an oxidant or a reducing agent or through electrochemical doping. Incidentally, in forming the compounds of the present invention into films or other formed or molded products, the compounds may be admixed, as required, with compounding ingredients such as heat stabilizer, light stabilizer, filler, reinforcing agent, etc.

EXAMPLE

Now, the present invention will be described more specifically and in detail below referring to examples thereof, but the invention is not limited to the examples.

Synthesis Example 1
Synthesis of 2,3-Dihydroxy-5-aminoquinoxaline
2,3-Dihydroxy-5-aminoquinoxaline was synthesized by the following methods (1) to (3).
(1) Synthesis of 2,3-diaminonitrobenzene

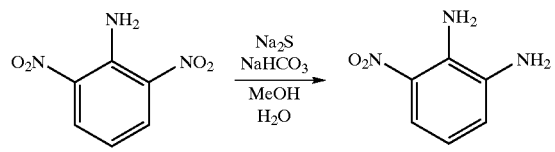

14 g of commercial 1-amino-2,5-dinitrobenzene was dissolved in 225 ml of methanol, and a solution of 60 g of sodium sulfate and 21 g of sodium hydrogencarbonate in 240 g was added to the methanol solution by use of a dropping funnel while maintaining the reaction temperature at 60° C. After the addition was over, the mixture was further stirred at 60° C. for 1 hr. After the reaction was over, the reaction mixture was cooled to room temperature, and the crystal precipitated was filtered out.

Amount obtained: 7.79 g (Yield 66.5%) Red brown microcrystals Melting point: 140° C. m/z: (FD+) 153 (Calcd.: 153.1396) $^1$H-NMR(500 MHz, $d_6$-DMSO, δ ppm): 7.72, 7.70, 7.24, 6.92, 6.62, 6.61, 6.60, 6.59, 5.92, 3.40.

(2) Synthesis of 2,3-dihydroxy-5-nitroquinoxaline

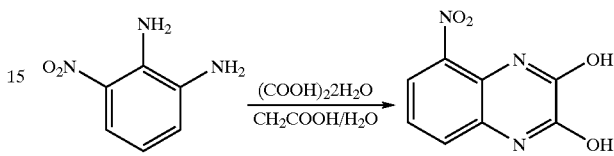

4 g (26.12 mmol) of 2,3-diaminonitrobenzene and 6.59 g (52.24 mmol) of commercial oxalic acid were dissolved in 50% acetic acid, and reaction was allowed at boiling point under an argon stream for 3 hr. After the reaction was over, the reaction mixture was cooled to room temperature, and the crystal precipitated was filtered out.

Amount obtained: 3.01 g (Yield: 55.6%) Yellow microcrystals m/z: 207 (Calcd.: 207.144)

(3) Synthesis of 2,3-dihydroxy-5-aminoquinoxaline

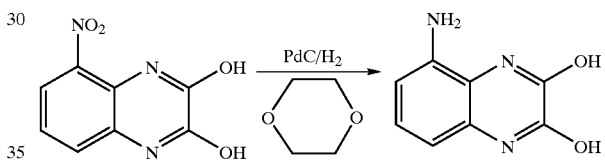

2.00 g of 2,3-dihydroxy-5-nitroquinoxaline was dissolved in 1:1 mixed solvent of methanol/dioxane, then the reaction system was sufficiently flushed with argon, and 1.00 g of Pd/C (anhydrous) was added to the reaction mixture. Thereafter, the reaction system was flushed with hydrogen, and reaction was allowed at room temperature for 20 hr. After the reaction was over, the reaction mixture was dispersed in a solution of 6.00 g of potassium carbonate in 130 ml of water, thereby dissolving the reaction product. Filtration was conducted, and 35% hydrochloric acid was gradually added to the solution obtained upon the filtration, to obtain precipitates.

Amount obtained: 1.10 g Pale yellow microcrystals m/z (FD+): 177 (Calcd.: 177.1616) $^{13}$C-NMR(500 MHz, $d_6$-DMSO, δ ppm): 155.80, 155.65, 135.96, 126.84, 124.13, 112.33, 109.60, 103.84.

Synthesis Example 2
Synthesis of 2,3-Diphenyl-5-aminoquinoxaline
2,3-Diphenyl-5-aminoquinoxaline was synthesized by the following methods (1) and (2).
(1) Synthesis of 2,3-diphenyl-5-nitroquinoxaline

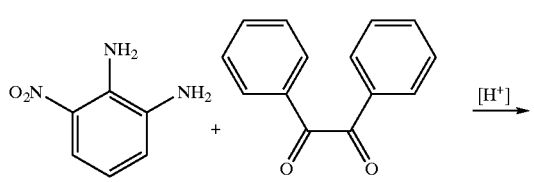

-continued

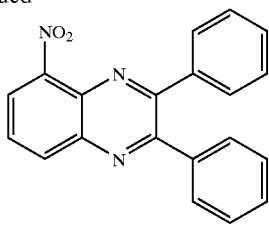

1.53 g (10 mmol) of 2,3-diaminonitrobenzene and 2.00 g (9.6 mmol) of benzil were placed in a four-necked flask, and were dissolved by adding a 1:1 mixed solvent of acetic acid/methanol thereto. Thereafter, reaction was allowed at 70° C. for 2 hr. After the reaction, the solvent was removed, and the reaction product was extracted on a silica gel column (ethyl acetate:hexane=1:1).

Amount obtained: 2.11 g Yellow microcrystals m/z(FD+): 327 (Calcd.: 327.24)

(2) Synthesis of 2,3-diphenyl-5-aminoquinoxaline

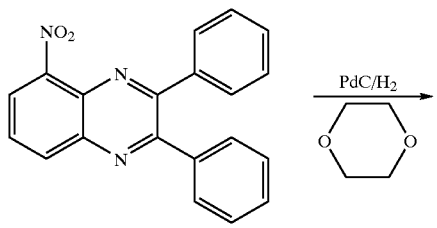

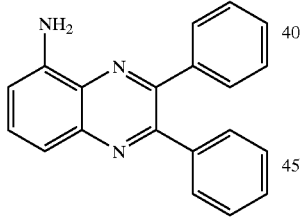

1.04 g of 2,3-diphenyl-5-nitroquinoxaline was dissolved in 30 g of dioxane, then the reaction system was flushed with argon, and 0.5 g of Pd/C (anhydrous) was added to the reaction mixture. After the reaction system was again flushed with argon sufficiently, hydrogen was added thereto, and reaction was allowed at room temperature for 30 hr. After the reaction was over, filtration was conducted, the reaction solvent was removed, and the reaction product was separated and purified on a silica gel column (ethyl acetate:hexane=1:3).

Amount obtained: 0.73 g Yellow microcrystals m/z: 297 (Calcd. M: 297.36) $^{13}$C-NMR(500 MHz, CDCl$_3$, δ ppm): 153.61, 150.12, 144.23, 141.96, 139.45, 139.35, 131.13, 130.09, 129.94, 128.77, 128.65, 128.35, 128.17, 117.21, 110.25.

Synthesis Example 3
Synthesis of 2,3-Di(4-methylphenyl)-5-aminoquinoxaline
2,3-Di(4-methylphenyl)-5-aminoquinoxaline was synthesized by the following methods (1) and (2).
(1) Synthesis of 2,3-di(4-methylphenyl)-5-nitroquinoxaline

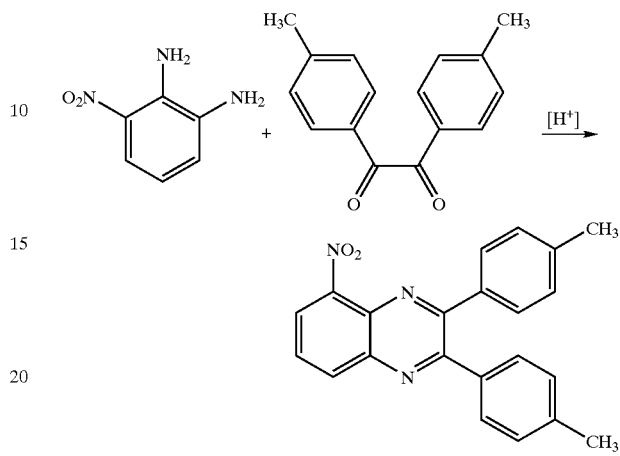

1.84 g (12 mmol) of 2,3-diaminonitrobenzene and 2.38 g (10 mmol) of 4,4'-dimethylbenzil were dissolved in 40 g of a 1:1 mixed solvent of acetic acid/methanol, and reaction was allowed at 80° C. for 4 hr. After the reaction was over, the solvent was removed, and the reaction product was extracted on a silica gel column.

Amount obtained: 1.30 g Yellow microcrystals m/z: 355 (Calcd. M: 355.39) $^{13}$C-NMR(500 MHz, CDCl$_3$, δ ppm): 154.90, 154,83, 147.09, 140.76, 140.13, 139.86, 135.60, 135.13, 133.71, 133.23, 130.28, 129.70, 129.32, 129.12, 128.41, 127.75, 124.21.

(2) Synthesis of 2,3-di(4-methylphenyl)-5-aminoquinoxaline

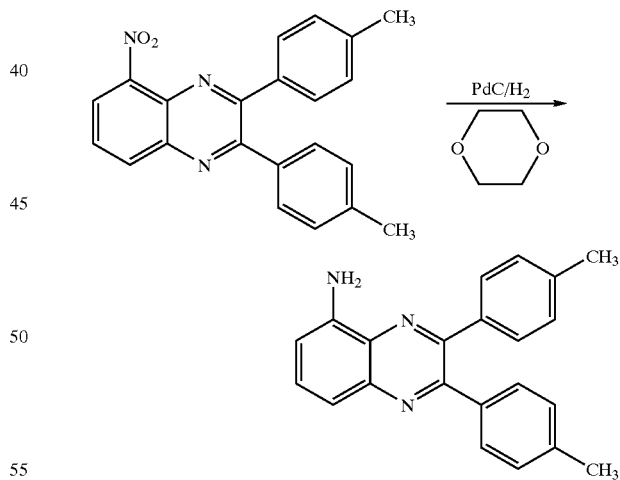

2.02 g (0.0057 mol) of 2,3-di(4-methylphenyl)-5-nitroquinoxaline was dissolved in 30 g of dioxane, then the reaction system was flushed with argon, and 0.6 g of PdC (anhydrous) was added thereto. After the reaction system was again flushed with argon, it was flushed with hydrogen, and reaction was allowed at room temperature for 18 hr. After the reaction was over, the reaction mixture was filtered, the filter cake was washed with acetone and dioxane, and filtration was again conducted. The solvent was removed from the filtrate obtained, and the reaction product was extracted on a silica gel column.

Amount obtained: 1.36 g Yellow microcrystals m/z: 325 (Calcd.: 325.14) $^{13}$C-NMR(500 MHz, CDCl$_3$, δ ppm): 153.61, 150.16, 144.09, 141.86, 138.66, 138.59, 136.70, 136.67, 131.27, 130.78, 129.93, 129.78, 129.04, 128.98, 117.24, 110.06.

Synthesis Example 4

Synthesis of 2,3-di(4-methoxyphenyl)-5-aminoquinoxaline 2,3-Di(4-methoxyphenyl)-5-aminoquinoxaline was synthesized by the following methods (1) and (2).

(1) Synthesis of 2,3-(4-dimethoxyphenyl)-nitroquinoxaline

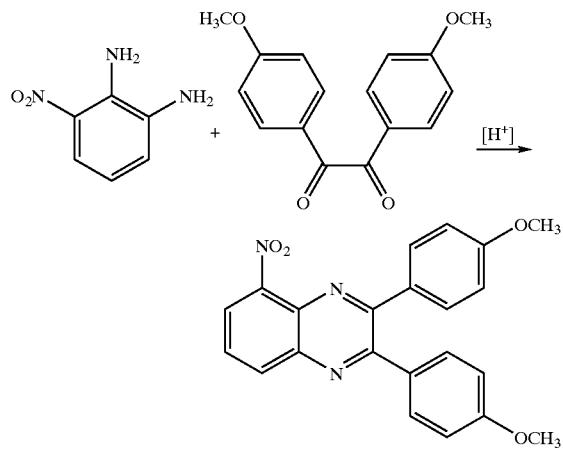

1.54 g (10 mmol) of 2,3-aminonitrobenzene and 2.25 g (8.3 mmol) of 4,4'-dimethoxybenzil were dissolved in 100 g of a 1:1 mixed solvent of methanol/acetic acid, and reaction was allowed at room temperature for 20 hr. After the reaction was over, the reaction mixture was filtrated. The filter cake was further washed with acetone and dioxane, and filtration was again conducted. The solvent was removed from the filtrate obtained, and the reaction product was extracted on a silica gel column.

Amount obtained: 1.24 g Yellow microcrystals m/z: 387 (Calcd.: 387.39) $^{13}$C-NMR(500 MHz, CDCl$_3$, δ ppm): 161.10, 160.91, 154.33, 154.25, 146.95, 140.65, 133.60, 133.14, 131.92, 130.84, 130.41, 127.51, 124.10, 114.10, 113.88.

(2) Synthesis of 2,3-di(4-methoxyphenyl)-5-aminoquinoxaline

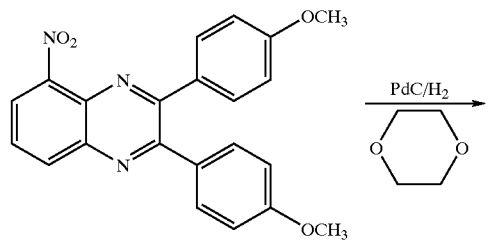

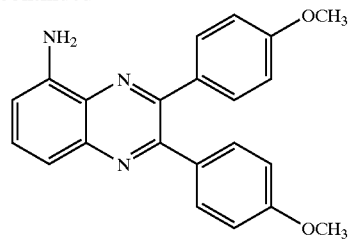

0.55 g (0.0014 mol) of 2,3-(4-dimethoxyphenyl)-5-nitroquinoxaline was dissolved in 30 g of dioxane, the reaction system was flushed sufficiently with argon, then 0.5 g of PdC was added thereto, and the reaction system was again flushed sufficiently with argon. The system was flushed with hydrogen gas, and reaction was allowed at room temperature for 24 hr. After the reaction was over, the reaction mixture was filtrated. The filter cake was further washed with acetone and dioxane, and filtration was again conducted. The solvent was removed from the filtrate obtained, and the reaction product was extracted on a silica gel column.

Amount obtained: 0.37 g Yellow microcrystals m/z: 325 (Calcd.: 325.43) $^{13}$C-NMR(500 MHz, CDCl$_3$, δ ppm): 160.14, 150.06, 153.13, 149.74, 144.01, 141.75, 131.39, 131.29, 130.62, 117.16, 113.83, 113.66, 110.01, 55.38.

Synthesis Example 5

Synthesis of 2,3-Di(4-bromophenyl)-5-aminoquinoxaline 2,3-Di(4-bromopheny)-5-aminoquinoxaline was synthesized by the following methods (1) and (2).

(1) Synthesis of 2,3-di(4-bromophenyl)-5-nitroquinoxaline

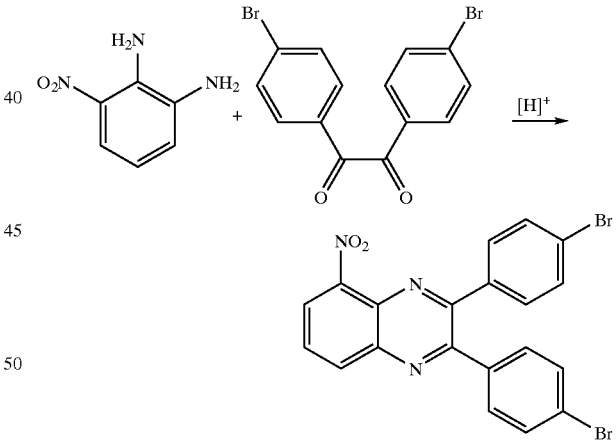

1.53 g (10 mmol) of 2,3-diaminonitrobenzene and 3.68 g (10 mmol) of 4,4'-dibromobenzil were dissolved in 80 g of a 1:1 mixed solvent of acetic acid/methanol, and reaction was allowed at 70° C. for 30 hr. After the reaction was over, the solvent was removed, and the reaction product was extracted on a silica gel column.

Amount obtained: 1.89 g
Yellow microcrystals
m/z: 485 (Calcd.: 485.12)
$^{13}$C-NMR(500 MHz, CDCl$_3$, δ ppm): 153.45, 153.36, 147.01, 140.79, 136.81, 136.38, 133.78, 133.26, 132.05, 131.87, 131.82, 131.38, 128.58, 124.98, 124.88, 124.71.

(2) Synthesis of 2,3-di(4-bromophenyl)-5-aminoquinoxaline

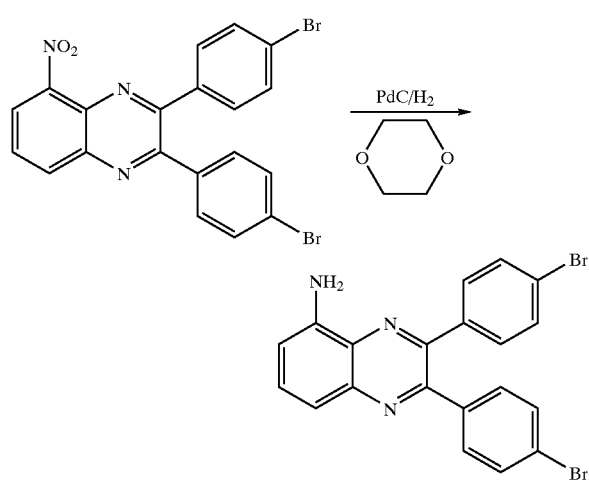

1.01 g (0.0021 mol) of 2,3-di(4-bromophenyl)-5-nitroquinoxaline was dissolved in 30 g of dioxane, and the reaction system was flushed sufficiently with argon. Thereafter, 0.3 g of PdC was added to the reaction mixture, the reaction system was again flushed sufficiently with argon, the system was then flushed with hydrogen gas, and reaction was allowed at room temperature for 24 hr. After the reaction was over, the reaction mixture was filtered, the filter cake was further washed with acetone and dioxane, and filtration was again conducted. The solvent was removed from the filtrate obtained, and the reaction product was extracted on a silica gel column.

Amount obtained: 0.66 g Yellow microcrystals m/z: 455 (Calcd.: 455.12)

Synthesis Example 6

Synthesis of 2,3-Dithienyl-5-aminoquinoxaline 2,3-Dithienyl-5-aminoquinoxaline was synthesized by the following methods (1) and (2).

(1) Synthesis of 2,3-dithienyl-5-nitroquinoxaline

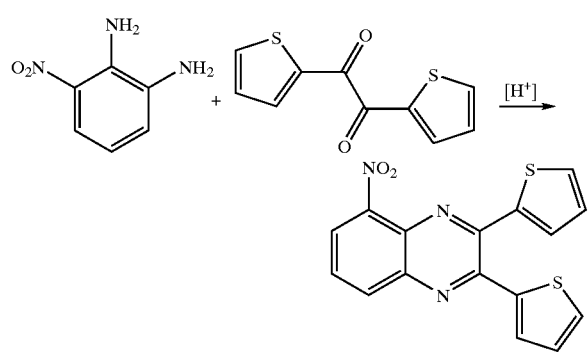

0.022 g (0.099 mmol) of 2,3-diaminonitrobenzene and 0.01938 g (0.198 mmol) of 2,2'-thienyl were dissolved in 3 g of a 1:1 mixed solvent of acetic acid/methanol, and reaction was allowed at 70° C. for 30 hr. After the reaction was over, the solvent was removed, and the reaction product was extracted on a silica gel column.

Amount obtained: 0.04 g Yellow microcrystals m/z: 339 (Clacd.: 339.40)

(2) Synthesis of 2,3-dithienyl-5-aminoquinoxaline

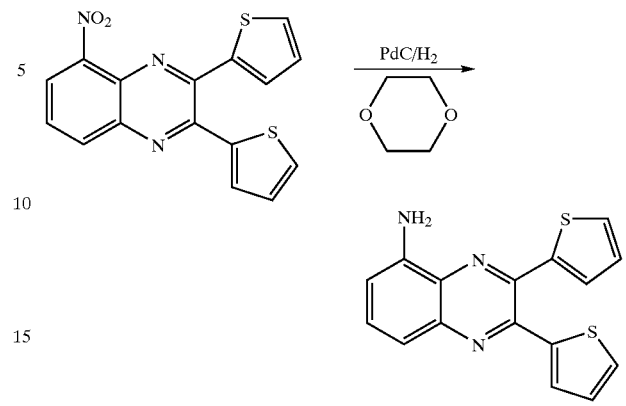

1.01 g (0.0030 mol) of 2,3-dithienyl-5-nitroquinoxalne was dissolved in 30 g of dioxane, and the reaction system was flushed sufficiently with argon. Thereafter, 0.3 g of PdC was added to the reaction mixture, the reaction system was again flushed sufficiently with argon, the system was then flushed with hydrogen gas, and reaction was allowed at room temperature for 24 hr. After the reaction was over, the reaction mixture was filtered, the filter cake was further washed with acetone and dioxane, and filtration was again conducted. The solvent was removed from the filtrate obtained, and the reaction product was extracted on a silica gel column.

Amount obtained: 0.40 g Yellowish brown microcrystals m/z: 309 (Calcd.: 309.42)

Example 1

Synthesis of Poly(2,3-diphenyl-5-aminoquinoxaline)

1.1698 g of hydrochloric acid was added to 0.1490 g of 2,3-diphenyl-5-aminoquinoxaline obtained in Synthesis Example 2, whereby 2,3-diphenyl-5-aminoquinoxaline was dissolved as a hydrochloride. Thereafter, 6.0 g of DMF solvent was added to the solution.

Electrolytic polymerization was conducted by using Ag/Ag$^+$ as a reference electrode, a platinum mesh electrode as a counter electrode, and ITO as a working electrode. The electrolytic polymerization was conducted potantiostatically at a potential of 1300 mV for 1000 sec. The solid obtained was analyzed by TOF (time of flight) mass spectrometry, and was identified.

Example 2

Synthesis of Poly(2,3-di(4-methylphenyl)-5-aminoquinoxaline)

0.16 g of 2,3-di(4-methylphenyl)-5-aminoquinoxaline obtained in Synthesis Example 3 was dissolved in 0.54 g of hydrochloric acid, and 6.5 g of DMF was added to the solution. Electrolytic polymerization was conducted by using Ag/Ag$^+$ as a reference electrode, a platinum mesh electrode as a counter electrode, and ITO as a working electrode. The electrolytic polymerization was conducted potentiostatically at a potential of 1300 mV for 1000 sec. The solid obtained was analyzed by TOF mass spectrometry, and was identified.

Example 3

Synthesis of Poly(2,3-di(4-dimethoxyphenyl)-5-aminoquinoxaline)

0.17 g of 2,3-di(4-dimethoxyphenyl)-5-aminoquinoxaline obtained in Synthesis Example 4 was dissolved in 1.12 g of hydrochloric acid, and 6.5 g of DMF was added to the solution. Electrolytic polymerization was conducted by using Ag/Ag+ as a reference electrode, a platinum mesh electrode as a counter electrode, and ITO as a working electrode. The electrolytic polymerization was conducted potentiostatically at a potential of 1300 mV for 1000 sec. The solid obtained was analyzed by TOF mass spectrometry, and was identified.

Example 4
Synthesis of Poly(2,3-di(4-bromophenyl)-5-aminoquinoxaline)

0.45 g of 2,3-di(4-bromophenyl)-5-aminoquinoxaline obtained in Synthesis Example 5 was dissolved in 1.12 g of hydrochloric acid, and 6.5 g of DMF was added to the solution. Electrolytic polymerization was conducted by using Ag/Ag+ as a reference electrode, a platinum mesh electrode as a counter electrode, and ITO as a working electrode. The electrolytic polymerization was conducted potentiostatically at a potential of 1300 mV for 1000 sec. The solid obtained was analyzed by TOF mass spectrometry, and was identified.

Example 5
Synthesis of Poly(2,3-dithienyl-5-aminoquinoxaline)

0.36 g of 2,3-dithienyl-5-aminoquinoxaline obtained in Synthesis Example 6 was dissolved in 1.12 g of hydrochloric acid, and 6.5 g of DMF was added to the solution. Electrolytic polymerization was conducted by using Ag/Ag+ as a reference electrode, a platinum mesh electrode as a counter electrode, and ITO as a working electrode. The electrolytic polymerization was conducted potentiostatically at a potential of 1300 mV for 1000 sec. The solid obtained was analyzed by TOF mass spectrometry, and was identified.

Example 6
Chemical Oxidation Polymerization of Poly(2,3-diphenyl-5-aminoquinoxaline)

0.24 g (0.80 mmol) of 2,3-diphenyl-5-aminoquinoxaline obtained in Synthesis Example 2 was dissolved in 17 ml of 35% hydrochloric acid, and 12 g of DMF was added to the solution. To the resulting solution, an aqueous solution of 0.18 g (0.80 mmol) of ammonium persulfate in 2 g of water was added dropwise at a reaction temperature of 10° C. After the dropwise addition, the reaction mixture was stirred at room temperature for 24 hours, to effect reaction. After the reaction was over, the reaction product was filtered out, then washed with methanol and acetone, and the remaining solid matter was analyzed by TOF mass spectrometry, and was identified.

Example 7
Chemical Oxidation Polymerization of Poly(2,3-di(4-methylphenyl)-5-aminoquinoxaline)

0.268 g (0.80 mmol) of 2,3-di(4-methylphenyl)-5-aminoquinoxaline obtained in Synthesis Example 3 was dissolved in 17 ml of 35% hydrochloric acid, and 12 g of DMF was added to the solution. To the resulting solution, an aqueous solution of 0.18 g (0.80 mmol) of ammonium persulfate in 2 g of water was added dropwise at a reaction temperature of 10° C. After the dropwise addition, the reaction mixture was stirred at room temperature for 24 hr, to effect reaction. After the reaction was over, the reaction product was filtered out, then washed with methanol and acetone, and the remaining solid matter was analyzed by TOF mass spectrometry, and was identified.

Example 8
Chemical Oxidation Polymerization of Poly(2,3-di(4-methoxyphenyl)-5-aminoquinoxaline 0.29 g (0.80 mmol) of 2,3-di(4-methoxyphenyl)-5-aminoquinoxaline obtained in Synthesis Example 4 was dissolved in 17 ml of 35% hydrochloric acid, and 12 g of DMF was added to the solution. To the resulting solution, an aqueous solution of 0.18 g (0.80 mmol) of ammonium persulfate in 2 g of water was added dropwise at a reaction temperature of 10° C. After the dropwise addition, the reaction mixture was stirred at room temperature for 24 hr, to effect reaction. After the reaction was over, the reaction product was filtered out, then washed with methanol and acetone, and the remaining solid matter was analyzed by TOF mass spectrometry, and was identified.

[Molecular Weight and Molecular Weight Distribution of Polymers]

The poly(5-aminoquinoxalines) of the general formula (1) obtained in Examples 1 to 5 above were subjected to molecular weight measurement by TOF mass spectrometry. The results are shown in Table 1 below.

TABLE 1

Molecular Weight Determined by TOF Mass Spectrometry

| Example | Polymer | Mn | Mw | Mz |
| --- | --- | --- | --- | --- |
| Example 1 | Poly(2,3-diphenyl-5-aminoquinoxaline) | 1230 | 1923 | 1656 |
| Example 2 | Poly(2,3-di(4-methylphenyl)-5-aminoquinoxaline) | 1194 | 1850 | 1628 |
| Example 3 | Poly(2,3-di(4-dimethoxyphenyl)-5-aminoquinoxaline) | 4547 | 3500 | 3012 |
| Example 4 | Poly(2,3-di(4-bromophenyl)-5-aminoquinoxaline) | 2123 | 2851 | 2492 |
| Example 5 | Poly(2,3-dithienyl-5-aminoquioxaline) | 1353 | 1557 | 1463 |
| Example 6 | Poly(2,3-diphenyl-5-aminoquinoxaline) | 1039 | 1054 | |
| Example 7 | Poly(2,3-di(4-methylphenyl)-5-aminoquinoxaline) | 1154 | 1197 | |
| Example 8 | Poly(2,3-di(4-methoxyphenyl)-5-aminoquinoxaline | 1354 | 1278 | |

Mn: number average molecular weight
Mw: weight average molecular weight
Mz: z average molecular weight Example 9
Chemical Oxidation Polymerization of Poly(2,3-diphenyl)-5-aminoquinoxaline 0.24 g (0.80 mmol) of 2,3-diphenyl-5-aminoquinoxaline obtained in Synthesis Example 2 was dissolved in 1 g of chloroform. To the resulting solution, 1 g of chloroform having 0.001 g of anhydrous ferric chloride ($FeCl_3$) dissolved therein was added dropwise at room temperature under nitrogen gas atmosphere. After the dropwise addition, the reaction mixture was stirred at room temperature for 24 hours, to effect polymerization reaction.

Example 10
Chemical Oxidation Polymerization of Poly(2,3-diphenyl)-5-aminoquinoxaline 0.24 g (0.80 mmol) of 2,3-diphenyl-5-aminoquinoxaline obtained in Synthesis Example 2 was dissolved in 1 g of chloroform. To the resulting solution, 1 g of chloroform having 0.001 g of anhydrous ferric chloride ($FeCl_3$) dissolved therein was added dropwise at room temperature under nitrogen gas atmosphere. After the dropwise addition, the reaction mixture was stirred at a temperature of 40° C. for 24 hours, to effect polymerization reaction.

Example 11
Chemical Oxidation Polymerization of Poly(2,3-diphenyl)-5-aminoquinoxaline 0.24 g (0.80 mmol) of 2,3-diphenyl-5-aminoquinoxaline obtained in Synthesis Example 2 was dissolved in 1 g of chloroform. To the resulting solution, 1 g of chloroform having 0.001 g of anhydrous ferric chloride (FeCl$_3$) dissolved therein was added dropwise at room temperature under nitrogen gas atmosphere. After the dropwise addition, the reaction mixture was stirred at a temperature of 60° C. for 24 hours, to effect polymerization reaction.

Example 12
Chemical Oxidation Polymerization of Poly(2,3-di(4-methylphenyl)-5-aminoquinoxaline)

0.26 g (0.80 mmol) of 2,3-di(4-methylphenyl)-5-aminoquinoxaline obtained in Synthesis Example 3 was dissolved in 1 g of chloroform. To the resulting solution, 1 g of chloroform having 0.001 g of anhydrous ferric chloride (FeCl$_3$) dissolved therein was added dropwise at room temperature under nitrogen gas atmosphere. After the dropwise addition, the reaction mixture was stirred at room temperature for 24 hours, to effect polymerization reaction.

Example 13
Chemical Oxidation Polymerization of Poly(2,3-di(4-methylphenyl)-5-aminoquinoxaline)

0.26 g (0.80 mmol) of 2,3-di(4-methylphenyl)-5-aminoquinoxaline obtained in Synthesis Example 2 was dissolved in 1 g of chloroform. To the resulting solution, 1 g of chloroform having 0.001 g of anhydrous ferric chloride (FeCl$_3$) dissolved therein was added dropwise at room temperature under nitrogen gas atmosphere. After the dropwise addition, the reaction mixture was stirred at a temperature of 60° C. for 24 hours, to effect polymerization reaction.

After the reaction (each reaction of Examples 9–13) was over, the reaction product was filtered out, and then purified by reprecipitation with methanol. The molecular weight of the resulting polymer was measured by GPC in the following measurement condition.

Column: TSK Gel super H3000 (TOSOH CORPORATION)
Eluent: DMF (0.6 ml/min; 3.5 MPa)

TABLE 2

Molecular Weight by GPC

| Example | Polymer | Mn | Mw |
|---|---|---|---|
| Example 9 | Poly(2,3-diphenyl-5-aminoquinoxaline) | 54600 | 63200 |
| Example 10 | Poly(2,3-diphenyl-5-aminoquinoxaline) | 78400 | 83500 |
| Example 11 | Poly(2,3-diphenyl-5-aminoquinoxaline) | 63200 | 65400 |
| Example 12 | Poly(2,3-di(4-methylphenyl)-5-aminoquinoxaline) | 38500 | 43400 |
| Example 13 | Poly(2,3-di(4-methylphenyl)-5-aminoquinoxaline) | 54300 | 55400 |

Mn: number average molecular weight
Mw: weight average molecular weight

[Measurement of Electrical Conductivity]

The poly(aminoquinoxalines) of the general formula (1) obtained in Examples 1 to 5 above were subjected to measurement of electrical conductivity as follows. Each polymer was favorably molded into a pellet by a compression molding machine, the pellet was cut to a rectangular shape, the rectangular specimen was fixed between two platinum electrodes by use of a carbon paste, and the electrical conductivity of the specimen was measured (two terminal method).

As a result, it was found that the polymers appear to be yellow to red in color in the state of being doped with hydrochloric acid. The results of measurement of electrical conductivity are shown in Table 2 below.

TABLE 3

| Example | Polymer | Conductivity (S/cm) |
|---|---|---|
| Example 1 | Poly(2,3-diphenyl-5-amimoquinoxaline) | 100 |
| Example 2 | Poly(2,3-di(4-methylphenyl)-5-aminoquinoxaline) | 100 |
| Example 3 | Poly(2,3-di(4-dimethoxyphenyl)-5-aminoquinoxaline) | 70 |
| Example 4 | Poly(2,3-di(4-bromophenyl)-5-aminoquinoxaline) | 80 |
| Example 5 | Poly(2,3-dithienyl-5-aminoquinoxaline) | 70 |

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A poly(5-aminoquinoxaline) having the general formula (1):

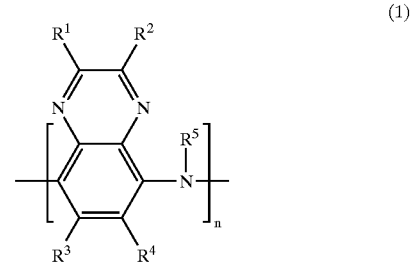

(1)

in which $R^1$ and $R^2$ each independently represent a hydrogen atom, a hydroxyl group, a phenyl group, a substituted phenyl group, a biphenyl group, a substituted biphenyl group, a thienyl group, a substituted thienyl group, a naphthyl group, a substituted naphthyl group, a pyrrolyl group, a substituted pyrrolyl group, a furyl group, a substituted furyl group, an alkyl group, or an alkoxyl group; $R^3$ and $R^4$ each independently represent a hydrogen atom, an alkyl group, an alkoxyl group, a cyano group, a phenyl group, a substituted phenyl group, a biphenyl group, a substituted biphenyl group, a thienyl group, a substituted thienyl group, a pyrrolyl group, a substituted pyrrolyl group, a furyl group, a substituted furyl group, a naphthyl group, or a substituted naphthyl group; $R^5$ represents a hydrogen atom, an alkyl group, an alkoxyl group, an acetyl group, a cyano group, a phenyl group, a substituted phenyl group, a biphenyl group, a substituted biphenyl group, a thienyl group, a substituted thienyl group, a pyrrolyl group, a substituted pyrrolyl group, a naphthyl group, or a substituted naphthyl group; and n represents a positive integer of not less than three.

2. A poly(5-aminoquinoxaline) as set forth in claim 1, wherein $R^1$ and $R^2$ in the general formula (1) are independently groups having the general formula (2):

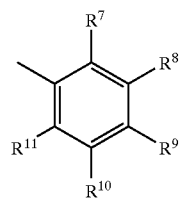

(2)

in which $R^7$ to $R^{11}$ each independently represent a hydrogen atom, a halogen atom, a cyano group, an amino group, a cyanoalkyl group having one to four carbon atoms, a haloalkyl group having one to four carbon atoms, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group.

3. A poly(5-aminoquinoxaline) as set forth in claim 1, wherein $R^1$ and $R^2$ in the general formula (1) are independently groups having the general formula (3):

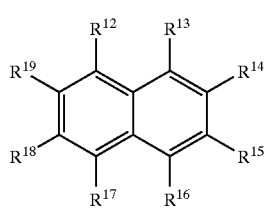

(3)

in which either one of $R^{12}$ to $R^{19}$ is coupled to the quinoxaline ring, and the others of $R^{12}$ to $R^{19}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group.

4. A poly(5-aminoquinoxaline) as set forth in claim 1, wherein $R^1$ and $R^2$ in the general formula (1) are independently groups having the general formula (4):

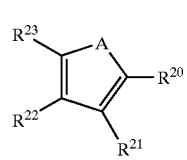

(4)

in which either one of $R^{20}$ to $R^{23}$ is coupled to the quinoxaline ring, and the others of $R^{20}$ to $R^{23}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a biphenyl group, a substituted biphenyl group, a naphthyl group, a substituted naphthyl group, a thienyl group, a substituted thienyl group, an epoxy group, or a vinyl group; and A represents NH, O, or S.

5. A poly(5-aminoquinoxaline) as set forth in claim 1, wherein $R^1$ and $R^2$ in the general formula (1) are independently groups having the general formula (5):

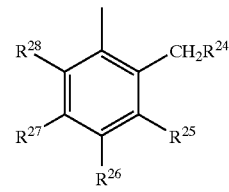

(5)

in which $R^{24}$ represents a halogen atom or a cyano group; and $R^{25}$ to $R^{28}$ each independently represent a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

6. A poly(5-aminoquinoxaline) as set forth in claim 1, wherein $R^5$ in the general formula (1) is a group having the general formula (6):

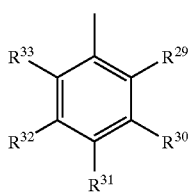

(6)

in which $R^{29}$ to $R^{33}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

7. A poly(5-aminoquinoxaline) as set forth in claim 1, wherein $R^5$ in the general formula (1) is a group having the general formula (7):

(7)

in which $R^{34}$ to $R^{36}$ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Z represents NH, O, or S.

8. A poly(5-aminoquinoxaline) as set forth in claim 1, wherein $R^5$ in the general formula (1) is a group having the general formula (8):

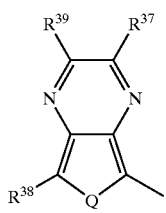
(8)

in which R³⁷ to R³⁹ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group; and Q represents NH, O, or S.

9. A poly(5-aminoquinoxaline) as set forth in claim 1, wherein R⁵ in the general formula (1) is a group having the general formula (9):

(9)

in which R⁴⁰ to R⁴⁶ each independently represent a hydrogen atom, a halogen atom, a cyano group, an amino group, an alkyl group having one to ten carbon atoms, an alkoxyl group having one to ten carbon atoms, a nitro group, a phenyl group, a substituted phenyl group, a naphthyl group, a substituted naphthyl group, a thienyl group, a substituted thienyl group, an epoxy group, or a vinyl group.

10. A film formed by spin coating or casting of a poly(5-aminoquinoxaline) as set forth in claim 1.

11. A film formed by compression molding of a poly(5-aminoquinoxaline) as set forth in claim 1.

12. An electrochromic device comprised of a poly(5-aminoquinoxaline) as set forth in claim 1.

13. An active substance or an electrode for a battery, comprised of a poly(5-aminoquinoxaline) as set forth in claim 1.

14. A semiconductor comprised of a poly(5-aminoquinoxaline) as set forth in claim 1.

15. A p-type semiconductor produced by oxidizing a poly(5-aminoquinoxaline) as set forth in claim 1 by an oxidant or electrochemical doping.

16. An n-type semiconductor produced by reducing a poly(5-aminoquinoxaline) as set forth in claim 1 by a reducing agent or electrochemical doping.

17. A solar cell comprising a p-type semiconductor as set forth in claim 15 and an n-type semiconductor as set forth in claim 16.

18. An organic electroluminescence device comprised of a poly(5-aminoquinoxaline) as set forth in claim 1.

19. A non-linear organic material comprised of a poly(5-aminoquinoxaline) as set forth in claim 1.

* * * * *